US010527368B2

(12) United States Patent
Poltorak (10) Patent No.: US 10,527,368 B2
(45) Date of Patent: *Jan. 7, 2020

(54) FRACTAL HEAT TRANSFER DEVICE

(71) Applicant: Fractal Heatsink Technologies LLC, Miami, FL (US)

(72) Inventor: Alexander Poltorak, Monsey, NY (US)

(73) Assignee: Fractal Heatsink Technologies LLC, Miami, FL (US)

( * ) Notice: Subject to any disclaimer, the term of this patent is extended or adjusted under 35 U.S.C. 154(b) by 533 days.

This patent is subject to a terminal disclaimer.

(21) Appl. No.: 14/817,962

(22) Filed: Aug. 4, 2015

(65) Prior Publication Data

US 2015/0342093 A1    Nov. 26, 2015

Related U.S. Application Data

(63) Continuation of application No. 13/106,640, filed on May 12, 2011, now Pat. No. 9,228,785.

(Continued)

(51) Int. Cl.
*H05K 7/20* (2006.01)
*F28F 21/02* (2006.01)
(Continued)

(52) U.S. Cl.
CPC ......... *F28F 21/02* (2013.01); *H05K 7/20509* (2013.01); *F28D 2021/0029* (2013.01);
(Continued)

(58) Field of Classification Search
CPC ............ F28D 2021/0029; H01L 23/467; F28F 13/02; F28F 13/06; F28F 13/12;
(Continued)

(56) References Cited

U.S. PATENT DOCUMENTS 5,870,284 A    2/1999  Stewart et al.
6,323,432 B1 *  11/2001  Campbell ........... H01L 23/3733
117/903

(Continued)

OTHER PUBLICATIONS

Liu, S., et al., "Heat Transfer and Pressure Drop in Fractal Microchannel Heat Sink for Cooling of Electronic Chips," 44 Heat Mass Transfer 221 (2007).

(Continued)

*Primary Examiner* — Joel M Attey
(74) *Attorney, Agent, or Firm* — Tully Rinckey PLLC; Steven M. Hoffberg (57) ABSTRACT

A heatsink comprising a heat exchange device having a plurality of heat exchange elements each having a surface boundary with respect to a heat transfer fluid, having a fractal variation therebetween, wherein the heat transfer fluid is induced to flow with respect to the plurality of fractally varying heat exchange elements such that flow-induced vortices are generated at non-corresponding locations of the plurality of fractally varying heat exchange elements, resulting in a reduced resonance as compared to a corresponding heat exchange device having a plurality of heat exchange elements that produce flow-induced vortices at corresponding locations on the plurality of heat exchange elements.

23 Claims, 3 Drawing Sheets

Related U.S. Application Data (60) Provisional application No. 61/331,103, filed on May 4, 2010.

(51) Int. Cl.
*F28F 13/12* (2006.01)
*F28F 13/06* (2006.01)
*F28F 13/02* (2006.01)
*H01L 23/467* (2006.01)
*F28F 9/02* (2006.01)
*F28D 21/00* (2006.01)

(52) U.S. Cl.
CPC ............ *F28F 9/0234* (2013.01); *F28F 13/02* (2013.01); *F28F 13/06* (2013.01); *F28F 13/12* (2013.01); *F28F 2210/02* (2013.01); *F28F 2215/10* (2013.01); *F28F 2255/20* (2013.01); *F28F 2260/00* (2013.01); *H01L 23/467* (2013.01)

(58) Field of Classification Search
CPC .... F28F 21/02; F28F 2215/10; F28F 2255/20; F28F 2260/00; F28F 9/0234; F28F 2210/02; H05K 7/20509
USPC ...................... 165/80.1, 80.3, 185
See application file for complete search history.

(56) References Cited

U.S. PATENT DOCUMENTS

| | | | |
|---|---|---|---|
| 7,351,360 B2 | 1/2008 | Hougham et al. | |
| 2002/0062648 A1* | 5/2002 | Ghoshal | F28D 15/0233 62/3.7 |
| 2004/0238163 A1* | 12/2004 | Harman | F24J 3/00 165/181 |
| 2005/0126766 A1* | 6/2005 | Lee | B82Y 10/00 165/133 |
| 2006/0113065 A1* | 6/2006 | Wolford | F28D 15/0233 165/104.26 |
| 2008/0149304 A1* | 6/2008 | Slaughter | B22F 3/1055 165/80.2 |
| 2009/0050293 A1* | 2/2009 | Kuo | H01L 23/367 165/80.3 |
| 2009/0086436 A1* | 4/2009 | Kluge | F21S 48/328 361/707 |
| 2009/0173334 A1* | 7/2009 | Krs | F24J 2/42 126/569 |
| 2009/0321045 A1 | 12/2009 | Hernon et al. | |
| 2010/0044018 A1* | 2/2010 | Furberg | C25D 5/16 165/133 |
| 2010/0139306 A1* | 6/2010 | Krenik | F25B 9/004 62/402 |
| 2012/0193085 A1* | 8/2012 | Whittle | F28F 3/022 165/185 |

OTHER PUBLICATIONS

International Search Report for counterpart application PCT/IB2011/001026 dated Dec. 6, 2011.
International Preliminary Report on Patentability and Written Opinion for counterpart application PCT/IB2011/001026 dated Feb. 9, 2016.

* cited by examiner

Optimum plate spacing

(1) $S_{opt} = k_s \cdot \left(\dfrac{L}{dT}\right)^{0.25} \cdot \cos(\gamma)^{-0.25}$ $\gamma_{opt} = \operatorname{atan}\left(\dfrac{1}{3} \cdot \dfrac{H}{W}\right)$ \quad\quad $\dfrac{H}{W} < \sqrt{3}$ $\gamma_{opt} = \dfrac{\pi}{4} - 0.508 \cdot \left(\dfrac{H}{W}\right)^{-1.237}$ \quad\quad $\dfrac{H}{W} > \sqrt{3}$

Total heat dissiaption

(2) $\dot{Q} = k_v \cdot k_\gamma \cdot A_c \cdot H^{0.5} \cdot dT^{1.5}$ $k_\gamma = \sqrt{1 + \dfrac{1}{9} \cdot \left(\dfrac{H}{W}\right)^2}$ \quad\quad $\dfrac{H}{W} < \sqrt{3}$ $k_\gamma = 0.307 \cdot \left(\dfrac{H}{W}\right)^{-0.5} + 0.696 \cdot \left(\dfrac{H}{W}\right)^{0.5}$ \quad\quad $\dfrac{H}{W} > \sqrt{3}$

Applied equation

(3) $\dot{Q} = \eta_v \cdot k_v \cdot k_\gamma \cdot A_c \cdot H^{0.5} \cdot dT_{ref}^{1.5}$

---

$dT$ = Temperature difference [K]

$A_c = W \cdot D$ $\eta_v$ = Volumetric efficiency [--]

$\dot{Q}$ = Heat dissipation [W]

FRACTAL HEAT TRANSFER DEVICE

CROSS REFERENCE TO RELATED APPLICATIONS

The present application is a Continuation of U.S. patent application Ser. No. 13/106,640, filed May 12, 2011, which is a non-provisional of, and claims benefit of priority under 35 U.S.C. 119(e) from, U.S. Provisional Patent Application No. 61/331,103, filed May 4, 2010, and which claims priority under 35 U.S.C. 371 from PCT/IB11/01026, filed May 13, 2011, the entirety of which are expressly incorporated herein by reference.

FIELD OF THE INVENTION

This invention relates to the field of heatsinks or items that transfer heat between a concentrated source or sink and a fluid.

BACKGROUND OF THE INVENTION

A heat sink is a term for a component or assembly that transfers heat generated within a solid material to a fluid medium, such as air or a liquid. A heat sink is typically physically designed to increase the surface area in contact with the cooling fluid surrounding it, such as the air. Approach air velocity, choice of material, fin (or other protrusion) design and surface treatment are some of the design factors which influence the thermal resistance, i.e. thermal performance, of a heat sink.

A heat sink transfers thermal energy from a higher temperature to a lower temperature fluid medium. The fluid medium is frequently air, but can also be water or in the case of heat exchangers, refrigerants and oil. Fourier's law of heat conduction, simplified to a one-dimensional form in the x-direction, shows that when there is a temperature gradient in a body, heat will be transferred from the higher temperature region to the lower temperature region. The rate at which heat is transferred by conduction, $q_k$, is proportional to the product of the temperature gradient and the cross-sectional area through which heat is transferred:

$$q_k = -kA\frac{dT}{dx} \quad (1)$$

where $q_k$ is the rate of conduction, k is a constant which depends on the materials that are involved, A is the surface area through which the heat must pass, and dT/dx is the rate of change of temperature with respect to distance (for simplicity, the equation is written in one dimension). Thus, according to Fourier's law (which is not the only consideration by any means), heatsinks benefit from having a large surface area exposed to the medium into which the heat is to be transferred.

Consider a heat sink in a duct, where air flows through the duct, and the heat sink base is higher in temperature than the air. Assuming conservation of energy, for steady-state conditions, and applying Newton's law of cooling, gives the following set of equations.

$$\dot{Q} = \dot{m}c_{p,in}(T_{air,out} - T_{air,in}) \quad (2)$$

$$\dot{Q} = \frac{T_{hs} - T_{air,av}}{R_{hs}} \quad (3)$$

where $$T_{air,av} = \frac{T_{air,out} + T_{air,in}}{2} \quad (4)$$

Using the mean air temperature is an assumption that is valid for relatively short heat sinks. When compact heat exchangers are calculated, the logarithmic mean air temperature is used. $\dot{m}$ is the air mass flow rate in kg/s.

The above equations show that when the air flow through the heat sink decreases, this results in an increase in the average air temperature. This in turn increases the heat sink base temperature. And additionally, the thermal resistance of the heat sink will also increase. The net result is a higher heat sink base temperature. The inlet air temperature relates strongly with the heat sink base temperature. Therefore, if there is no air or fluid flow around the heat sink, the energy dissipated to the air cannot be transferred to the ambient air. Therefore, the heat sink functions poorly.

Other examples of situations in which a heat sink has impaired efficiency: Pin fins have a lot of surface area, but the pins are so close together that air has a hard time flowing through them; Aligning a heat sink so that the fins are not in the direction of flow; Aligning the fins horizontally for a natural convection heat sink. Whilst a heat sink is stationary and there are no centrifugal forces and artificial gravity, air that is warmer than the ambient temperature always flows upward, given essentially-still-air surroundings; this is convective cooling.

The most common heat sink material is aluminum. Chemically pure aluminum is not used in the manufacture of heat sinks, but rather aluminum alloys. Aluminum alloy 1050A has one of the higher thermal conductivity values at 229 W/m·K. However, it is not recommended for machining, since it is a relatively soft material. Aluminum alloys 6061 and 6063 are the more commonly used aluminum alloys, with thermal conductivity values of 166 and 201 W/m·K, respectively. The aforementioned values are dependent on the temper of the alloy.

Copper is also used since it has around twice the conductivity of aluminum, but is three times as heavy as aluminum. Copper is also around four to six times more expensive than aluminum, but this is market dependent. Aluminum has the added advantage that it is able to be extruded, while copper cannot. Copper heat sinks are machined and skived. Another method of manufacture is to solder the fins into the heat sink base.

Another heat sink material that can be used is diamond. With a value of 2000 W/mK it exceeds that of copper by a factor of five. In contrast to metals, where heat is conducted by delocalized electrons, lattice vibrations are responsible for diamond's very high thermal conductivity. For thermal management applications, the outstanding thermal conductivity and diffusivity of diamond is an essential. CVD diamond may be used as a sub-mount for high-power integrated circuits and laser diodes.

Composite materials can be used. Examples are a copper-tungsten pseudoalloy, AlSiC (silicon carbide in aluminum matrix), Dymalloy (diamond in copper-silver alloy matrix), and E-Material (beryllium oxide in beryllium matrix). Such materials are often used as substrates for chips, as their thermal expansion coefficient can be matched to ceramics and semiconductors.

Fin efficiency is one of the parameters which makes a higher thermal conductivity material important. A fin of a heat sink may be considered to be a flat plate with heat flowing in one end and being dissipated into the surrounding fluid as it travels to the other. As heat flows through the fin, the combination of the thermal resistance of the heat sink impeding the flow and the heat lost due to convection, the temperature of the fin and, therefore, the heat transfer to the fluid, will decrease from the base to the end of the fin. This factor is called the fin efficiency and is defined as the actual heat transferred by the fin, divided by the heat transfer were the fin to be isothermal (hypothetically the fin having infinite thermal conductivity). Equations 5 and 6 are applicable for straight fins.

$$\eta_f = \frac{\tanh(mL_c)}{mL_c} \quad (5)$$

$$mL_c = \sqrt{\frac{2h_f}{kt_f}} L_f \quad (6)$$

Where:
$h_f$ is the convection coefficient of the fin
  Air: 10 to 100 W/(m²K)
  Water: 500 to 10,000 W/(m²K)
k is the thermal conductivity of the fin material
  Aluminum: 120 to 240 W/(m·K)
$L_f$ is the fin height (m)
$t_f$ is the fin thickness (m)

Another parameter that concerns the thermal conductivity of the heat sink material is spreading resistance. Spreading resistance occurs when thermal energy is transferred from a small area to a larger area in a substance with finite thermal conductivity. In a heat sink, this means that heat does not distribute uniformly through the heat sink base. The spreading resistance phenomenon is shown by how the heat travels from the heat source location and causes a large temperature gradient between the heat source and the edges of the heat sink. This means that some fins are at a lower temperature than if the heat source were uniform across the base of the heat sink. This non-uniformity increases the heat sink's effective thermal resistance.

A pin fin heat sink is a heat sink that has pins that extend from its base. The pins can be, for example, cylindrical, elliptical or square. A second type of heat sink fin arrangement is the straight fin. These run the entire length of the heat sink. A variation on the straight fin heat sink is a cross cut heat sink. A straight fin heat sink is cut at regular intervals but at a coarser pitch than a pin fin type.

In general, the more surface area a heat sink has, the better it works. However, this is not always true. The concept of a pin fin heat sink is to try to pack as much surface area into a given volume as possible. As well, it works well in any orientation. Kordyban has compared the performance of a pin fin and a straight fin heat sink of similar dimensions. Although the pin fin has 194 cm² surface area while the straight fin has 58 cm², the temperature difference between the heat sink base and the ambient air for the pin fin is 50° C. For the straight fin it was 44° C. or 6° C. better than the pin fin. Pin fin heat sink performance is significantly better than straight fins when used in their intended application where the fluid flows axially along the pins rather than only tangentially across the pins.

Another configuration is the flared fin heat sink; its fins are not parallel to each other, but rather diverge with increasing distance from the base. Flaring the fins decreases flow resistance and makes more air go through the heat sink fin channel; otherwise, more air would bypass the fins. Slanting them keeps the overall dimensions the same, but offers longer fins. Forghan, et al. have published data on tests conducted on pin fin, straight fin and flared fin heat sinks. They found that for low approach air velocity, typically around 1 m/s, the thermal performance is at least 20% better than straight fin heat sinks. Lasance and Eggink also found that for the bypass configurations that they tested, the flared heat sink performed better than the other heat sinks tested.

The heat transfer from the heatsink is mediated by two effects: conduction via the coolant, and thermal radiation. The surface of the heatsink influences its emissivity; shiny metal absorbs and radiates only a small amount of heat, while matte black radiates highly. In coolant-mediated heat transfer, the contribution of radiation is generally small. A layer of coating on the heatsink can then be counterproductive, as its thermal resistance can impair heat flow from the fins to the coolant. Finned heatsinks with convective or forced flow will not benefit significantly from being colored. In situations with significant contribution of radiative cooling, e.g. in case of a flat non-finned panel acting as a heatsink with low airflow, the heatsink surface finish can play an important role. Matte-black surfaces will radiate much more efficiently than shiny bare metal. The importance of radiative vs. coolant-mediated heat transfer increases in situations with low ambient air pressure (e.g. high-altitude operations) or in vacuum (e.g. satellites in space).

Fourier, J. B., 1822, Theorie analytique de la chaleur, Paris; Freeman, A., 1955, translation, Dover Publications, Inc, N.Y.

Kordyban, T., 1998, Hot air rises and heat sinks—Everything you know about cooling electronics is wrong, ASME Press, N.Y.

Anon, Unknown, "Heat sink selection", Mechanical engineering department, San Jose State University, Jan. 27, 2010. www.engr.sjsu.edu/ndejong/ME% 20146% 20files/ Heat% 20Sink.pptwww.engr.sjsu.edu/ndejong/ ME%20146%20files/Heat%20S ink.ppt Sergent, J. and Krum, A., 1998, Thermal management handbook for electronic assemblies, First Edition, McGraw-Hill.

Incropera, F.P. and DeWitt, D.P., 1985, Introduction to heat transfer, John Wiley and sons, NY.

Forghan, F., Goldthwaite, D., Ulinski, M., Metghalchi, M., Experimental and Theoretical Investigation of Thermal Performance of Heat Sinks, ISME May 2001.

Lasance, C.J.M and Eggink, H.J., 2001, A Method to Rank Heat Sinks in Practice: The Heat Sink Performance Tester, 21st IEEE SEMI-THERM Symposium.

ludens.cl/Electron/Thermal.html

Lienard, J.H., IV & V, 2004, A Heat Transfer Textbook, Third edition, MIT

Saint-Gobain, 2004, "Thermal management solutions for electronic equipment" 22 Jul. 2008 www.fff.saint-gob aim com/Media/Documents/S0000000000000001036/ ThermaCool%20Brochure.pdf Jeggels, Y.U., Dobson, R.T., Jeggels, D.H., Comparison of the cooling performance between heat pipe and aluminium conductors for electronic equipment enclosures, Proceedings of the 14th International Heat Pipe Conference, Florianopolis, Brazil, 2007.

Prstic, S., Iyengar, M., and Bar-Cohen, A., Bypass effect in high performance heat sinks, Proceedings of the International Thermal Science Seminar Bled, Slovenia, Jun. 11-14, 2000.

Mills, A.F., 1999, Heat transfer, Second edition, Prentice Hall.

Potter, C.M. and Wiggert, D.C., 2002, Mechanics of fluid, Third Edition, Brooks/Cole.

White, F.M., 1999, Fluid mechanics, Fourth edition, McGraw-Hill International.

Azar, A, et al., 2009, "Heat sink testing methods and common oversights", Qpedia Thermal E-Magazine, January 2009 Issue. www.gats.com/cpanel/UploadedPdf/January 20092.pdf Several structurally complex heatsink designs are discussed in Hernon, US App. 2009/0321045, incorporated herein by reference.

Heatsinks operate by removing heat from an object to be cooled into the surrounding air, gas or liquid through convection and radiation. Convection occurs when heat is either carried passively from one point to another by fluid motion (forced convection) or when heat itself causes fluid motion (free convection). When forced convection and free convection occur together, the process is termed mixed convection. Radiation occurs when energy, for example in the form of heat, travels through a medium or through space and is ultimately absorbed by another body. Thermal radiation is the process by which the surface of an object radiates its thermal energy in the form of electromagnetic waves. Infrared radiation from a common household radiator or electric heater is an example of thermal radiation, as is the heat and light (IR and visible EM waves) emitted by a glowing incandescent light bulb. Thermal radiation is generated when heat from the movement of charged particles within atoms is converted to electromagnetic radiation.

A heatsink tends to decrease the maximum temperature of the exposed surface, because the power is transferred to a larger volume. This leads to a possibility of diminishing return on larger heatsinks, since the radiative and convective dissipation tends to be related to the temperature differential between the heatsink surface and the external medium. Therefore, if the heatsink is oversized, the efficiency of heat shedding is poor. If the heatsink is undersized, the object may be insufficiently cooled, the surface of the heatsink dangerously hot, and the heat shedding not much greater than the object itself absent the heatsink.

The relationship between friction and convention in heatsinks is discussed by Frigus Primore in "A Method for Comparing Heat Sinks Based on Reynolds Analogy," available at www.frigprim.com/downloads/Reynolds_analogy_ heatsinks.PDF, last accessed Apr. 28, 2010. This article notes that for, plates, parallel plates, and cylinders to be cooled, it is necessary for the velocity of the surrounding fluid to be low in order to minimize mechanical power losses. However, larger surface flow velocities will increase the heat transfer efficiency, especially where the flow near the surface is turbulent, and substantially disrupts a stagnant surface boundary layer. Primore also discusses heatsink fin shapes and notes that no fin shape offers any heat dissipation or weight advantage compared with planar fins, and that straight fins minimize pressure losses while maximizing heat flow. Therefore, the art generally teaches that generally flat and planar surfaces are appropriate for most heatsinks.

Frigus Primore, "Natural Convection and Inclined Parallel Plates," www.frigprim.com/articels2/parallel_pl_Inc. html, last accessed Apr. 29, 2010, discusses the use of natural convection (i.e., convection due to the thermal expansion of a gas surrounding a solid heatsink in normal operating conditions) to cool electronics. One of the design goals of various heatsinks is to increase the rate of natural convection. Primore suggests using parallel plates to attain this result. Once again, Primore notes that parallel plate heatsinks are the most efficient and attempts to define the optimal spacing and angle (relative to the direction of the fluid flow) of the heatsinks according to the equations in FIG. 1.

In another article titled "Natural Convection and Chimneys," available at www.frigprim.com/articels2/parallel plchim.html, last accessed Apr. 29, 2010, Frigus Primore discusses the use of parallel plates in chimney heatsinks. One purpose of this type of design is to combine more efficient natural convection with a chimney. Primore notes that the design suffers if there is laminar flow (which creates a re-circulation region in the fluid outlet, thereby completely eliminating the benefit of the chimney) but benefits if there is turbulent flow which allows heat to travel from the parallel plates into the chimney and surrounding fluid.

In "Sub-Grid Turbulence Modeling for Unsteady Flow with Acoustic Resonance," available at www.metacomptech.com/cfd++/00-0473.pdf, last accessed Apr. 29, 2010, incorporated herein by reference, Paul Batten et al discuss that when a fluid is flowing around an obstacle, localized geometric features, such as concave regions or cavities, create pockets of separated flow which can generate self-sustaining oscillations and acoustic resonance. The concave regions or cavities serve to substantially reduce narrow band acoustic resonance as compared to flat surfaces. This is beneficial to a heatsink in a turbulent flow environment because it allows for the reduction of oscillations and acoustic resonance, and therefore for an increase in the energy available for heat transfer.

In S. Liu, "Heat Transfer and Pressure Drop in Fractal Microchannel Heat Sink for Cooling of Electronic Chips," 44 Heat Mass Transfer 221 (2007), Liu et al discuss a heatsink with a "fractal-like branching flow network." Liu's heatsink includes channels through which fluids would flow in order to exchange heat with the heatsink.

Y. J. Lee, "Enhanced Microchannel Heat Sinks Using Oblique Fins," IPACK 2009-89059, similarly discusses a heat sink comprising a "fractal-shaped microchannel based on the fractal pattern of mammalian circulatory and respiratory system." Lee's idea, similar to that of Liu, is that there would be channels inside the heatsink through which a fluid could flow to exchange heat with the heatsink. The stated improvement in Lee's heatsink is (1) the disruption of the thermal boundary layer development; and (2) the generation of secondary flows.

Pence, D. V., 2002, "Reduced Pumping Power and Wall Temperature in Microchannel Heat Sinks with Fractal-like Branching Channel Networks", Microscale Thermophys. Eng. 5, pp. 293-311, similarly, mentions heatsinks that have fractal-like channels allowing fluid to enter into the heat sink. The described advantage of Pence's structure is increased exposure of the heat sink to the fluid and lower pressure drops of the fluid while in the heatsink.

In general, a properly designed heatsink system will take advantage of thermally induced convection or forced air (e.g., a fan). In general, a turbulent flow near the surface of the heatsink disturbs a stagnant surface layer, and improves performance. In many cases, the heatsink operates in a non-ideal environment subject to dust or oil; therefore, the heatsink design must accommodate the typical operating conditions, in addition to the as-manufactured state.

Prior art heatsink designs have traditionally concentrated on geometry that is Euclidian, involving structures such as the pin fins, straight fins, and flares discussed above.

N J Ryan, D A Stone, "Application of the FD-TD method to modelling the electromagnetic radiation from heatsinks", IEEE International Conference on Electromagnetic Compatibility, 1997. 10th (1-3 Sep. 1997), pp: 119-124, discloses a fractal antenna which also serves as a heatsink in a radio frequency transmitter.

Lance Covert, Jenshan Lin, Dan Janning, Thomas Dalrymple, "5.8 GHz orientation-specific extruded-fin heatsink antennas for 3D RF system integration", 23 Apr. 2008 DOI: 10.1002/mop.23478, Microwave and Optical Technology Letters Volume 50, Issue 7, pages 1826-1831, July 2008 also provide a heatsink which can be used as an antenna.

SUMMARY OF THE INVENTION

Most heatsinks are designed using a linear or exponential relationship of the heat transfer and dissipating elements. A known geometry which has not generally been employed in fractal geometry. Some fractals are random fractals, which are also termed chaotic or Brownian fractals and include random noise components. In deterministic fractal geometry, a self-similar structure results from the repetition of a design or motif (or "generator") using a recursive algorithm, on a series of different size scales. As a result, certain types of fractal images or structures appear to have self-similarity over a broad range of scales. On the other hand, no two ranges within the design are identical.

A fractal is defined as "a rough or fragmented geometric shape that can be split into parts, each of which is (at least approximately) a reduced-size copy of the whole." Mandelbrot, B. B. (1982). That is, there is a recursive algorithm which describes the structure. The Fractal Geometry of Nature. W. H. Freeman and Company. ISBN 0-7167-1186-9. This property is termed "self-similarity." For a more detailed discussion of fractals, see the Wikipedia article thereon at en.wikipedia.org/wiki/Fractal (last accessed Apr. 14, 2010) incorporated herein by reference. Exemplary images of well-known fractal designs can also be viewed on the Wikipedia page. Due to the fact that fractals involve largely self-repeating patterns, each of which serves to increase the surface area in three-dimensional fractals (perimeter in two-dimensional fractals), three dimensional fractals in theory are characterized by infinite surface area (and two-dimensional fractals are characterized by infinite perimeter). In practical implementations, the scale of the smallest features which remain true to the generating algorithm may be 3-25 iterations of the algorithm. Less than three recursions, and the fractal nature is not apparent, while present manufacturing technologies limit the manufacture of objects with a large range of feature scales.

Per Wikipedia en- wikipedia-org/wiki/Fractal (last accessed Apr. 14, 2010), A fractal is "a rough or fragmented geometric shape that can be split into parts, each of which is (at least approximately) a reduced-size copy of the whole," [Mandelbrot, B.B. (1982). The Fractal Geometry of Nature. W.H. Freeman and Company. ISBN 0-7167-1186-9.] a property called self-similarity. Roots of mathematically rigorous treatment of fractals can be traced back to functions studied by Karl Weierstrass, Georg Cantor and Felix Hausdorff in studying functions that were analytic but not differentiable; however, the term fractal was coined by Benôit Mandelbrot in 1975 and was derived from the Latin fractus meaning "broken" or "fractured." A mathematical fractal is based on an equation that undergoes iteration, a form of feedback based on recursion. [Briggs, John (1992). Fractals: The Patterns of Chaos. London: Thames and Hudson, 1992. p. 148.]

A fractal often has the following features: [Falconer, Kenneth (2003). Fractal Geometry: Mathematical Foundations and Applications. John Wiley & Sons, Ltd. xxv]

It has a fine structure at arbitrarily small scales.

It is too irregular to be easily described in traditional Euclidean geometric language.

It is self-similar (at least approximately or stochastically).

It has a Hausdorff dimension which is greater than its topological dimension (although this requirement is not met by space-filling curves such as the Hilbert curve). [The Hilbert curve map is not a homeomorphism, so it does not preserve topological dimension. The topological dimension and Hausdorff dimension of the image of the Hilbert map in $R^2$ are both 2. Note, however, that the topological dimension of the graph of the Hilbert map (a set in $R^3$) is 1]

It has a simple and recursive definition.

Because they appear similar at all levels of magnification, fractals are often considered to be infinitely complex (in informal terms). Natural objects that are approximated by fractals to a degree include clouds, mountain ranges, lightning bolts, coastlines, snow flakes, various vegetables (cauliflower and broccoli), and animal coloration patterns. However, not all self-similar objects are fractals—for example, the real line (a straight Euclidean line) is formally self-similar but fails to have other fractal characteristics; for instance, it is regular enough to be described in Euclidean terms.

Images of fractals can be created using fractal-generating software. Images produced by such software are normally referred to as being fractals even if they do not have the above characteristics, such as when it is possible to zoom into a region of the fractal that does not exhibit any fractal properties. Also, these may include calculation or display artifacts which are not characteristics of true fractals.

To create a Koch snowflake, one begins with an equilateral triangle and then replaces the middle third of every line segment with a pair of line segments that form an equilateral "bump." One then performs the same replacement on every line segment of the resulting shape, ad infinitum. With every iteration, the perimeter of this shape increases by one third of the previous length. The Koch snowflake is the result of an infinite number of these iterations, and has an infinite length, while its area remains finite. For this reason, the Koch snowflake and similar constructions were sometimes called "monster curves."

The mathematics behind fractals began to take shape in the 17th century when mathematician and philosopher Gottfried Leibniz considered recursive self-similarity (although he made the mistake of thinking that only the straight line was self-similar in this sense).

It was not until 1872 that a function appeared whose graph would today be considered fractal, when Karl Weierstrass gave an example of a function with the non-intuitive property of being everywhere continuous but nowhere differentiable. In 1904, Helge von Koch, dissatisfied with Weierstrass's very abstract and analytic definition, gave a more geometric definition of a similar function, which is now called the Koch curve. (The image at right is three Koch curves put together to form what is commonly called the Koch snowflake.) Waclaw Sierpinski constructed his triangle in 1915 and, one year later, his carpet. Originally these geometric fractals were described as curves rather than the 2D shapes that they are known as in their modern constructions. The idea of self-similar curves was taken further by Paul Pierre Lévy, who, in his 1938 paper Plane or Space Curves and Surfaces Consisting of Parts Similar to the Whole described a new fractal curve, the Lévy C curve. Georg Cantor also gave examples of subsets of the real line with unusual properties—these Cantor sets are also now recognized as fractals.

Iterated functions in the complex plane were investigated in the late 19th and early 20th centuries by Henri Poincaré, Felix Klein, Pierre Fatou and Gaston Julia. Without the aid of modern computer graphics, however, they lacked the means to visualize the beauty of many of the objects that they had discovered.

In the 1960s, Benoît Mandelbrot started investigating self-similarity in papers such as How Long Is the Coast of Britain? Statistical Self-Similarity and Fractional Dimension, which built on earlier work by Lewis Fry Richardson. Finally, in 1975 Mandelbrot coined the word "fractal" to denote an object whose Hausdorff—Besicovitch dimension is greater than its topological dimension. He illustrated this mathematical definition with striking computer-constructed visualizations. These images captured the popular imagination; many of them were based on recursion, leading to the popular meaning of the term "fractal".

A class of examples is given by the Cantor sets, Sierpinski triangle and carpet, Menger sponge, dragon curve, space-filling curve, and Koch curve. Additional examples of fractals include the Lyapunov fractal and the limit sets of Kleinian groups. Fractals can be deterministic (all the above) or stochastic (that is, non-deterministic). For example, the trajectories of the Brownian motion in the plane have a Hausdorff dimension of 2.

Chaotic dynamical systems are sometimes associated with fractals. Objects in the phase space of a dynamical system can be fractals (see attractor). Objects in the parameter space for a family of systems may be fractal as well. An interesting example is the Mandelbrot set. This set contains whole discs, so it has a Hausdorff dimension equal to its topological dimension of 2—but what is truly surprising is that the boundary of the Mandelbrot set also has a Hausdorff dimension of 2 (while the topological dimension of 1), a result proved by Mitsuhiro Shishikura in 1991. A closely related fractal is the Julia set.

Escape-time fractals—(also known as "orbits" fractals) These are defined by a formula or recurrence relation at each point in a space (such as the complex plane). Examples of this type are the Mandelbrot set, Julia set, the Burning Ship fractal, the Nova fractal and the Lyapunov fractal. The 2d vector fields that are generated by one or two iterations of escape-time formulae also give rise to a fractal form when points (or pixel data) are passed through this field repeatedly.

Iterated function systems—These have a fixed geometric replacement rule. Cantor set, Sierpinski carpet, Sierpinski gasket, Peano curve, Koch snowflake, Harter-Highway dragon curve, T-Square, Menger sponge, are some examples of such fractals.

Random fractals—Generated by stochastic rather than deterministic processes, for example, trajectories of the Brownian motion, Lévy flight, fractal landscapes and the Brownian tree. The latter yields so-called mass- or dendritic fractals, for example, diffusion-limited aggregation or reaction-limited aggregation clusters.

Strange attractors—Generated by iteration of a map or the solution of a system of initial-value differential equations that exhibit chaos.

Fractals can also be classified according to their self-similarity. There are three types of self-similarity found in fractals:

Exact self-similarity—This is the strongest type of self-similarity; the fractal appears identical at different scales. Fractals defined by iterated function systems often display exact self-similarity.

Quasi-self-similarity—This is a loose form of self-similarity; the fractal appears approximately (but not exactly) identical at different scales. Quasi-self-similar fractals contain small copies of the entire fractal in distorted and degenerate forms. Fractals defined by recurrence relations are usually quasi-self-similar but not exactly self-similar.

Statistical self-similarity—This is the weakest type of self-similarity; the fractal has numerical or statistical measures which are preserved across scales. Most reasonable definitions of "fractal" trivially imply some form of statistical self-similarity. (Fractal dimension itself is a numerical measure which is preserved across scales.) Random fractals are examples of fractals which are statistically self-similar, but neither exactly nor quasi-self-similar.

Approximate fractals are easily found in nature. These objects display self-similar structure over an extended, but finite, scale range. Examples include clouds, snow flakes, crystals, mountain ranges, lightning, river networks, cauliflower or broccoli, and systems of blood vessels and pulmonary vessels. Coastlines may be loosely considered fractal in nature.

Trees and ferns are fractal in nature and can be modeled on a computer by using a recursive algorithm. This recursive nature is obvious in these examples—a branch from a tree or a frond from a fern is a miniature replica of the whole: not identical, but similar in nature. The connection between fractals and leaves are currently being used to determine how much carbon is contained in trees. ["Hunting the Hidden Dimension." Nova. PBS. WPMB-Maryland. 28 Oct, 2008.]

In 1999, certain self similar fractal shapes were shown to have a property of "frequency invariance"—the same electromagnetic properties no matter what the frequency—from Maxwell's equations (see fractal antenna). [Hohlfeld R, Cohen N (1999). "Self-similarity and the geometric requirements for frequency independence in Antennae". Fractals. 7 (1): 79-84]

This fractal nature is useful in a heatsink because the rate at which heat is transferred from a surface, either through convection or through radiation, is typically related to, and increasing with, the surface area. Of course, due to limitations in the technology used to build these heatsinks, engineering compromise is expected. However a feature of an embodiment of the designs proposed herein is that vortices induced by fluid flow over a heat transfer surface will be chaotically distributed over various elements of the surface, thus disrupting the stagnant surface boundary layer and increasing the effective surface area available for heat transfer, while avoiding acoustic resonance which may be apparent from a regular array of structures which produce vortices and turbulence.

Further, a large physical surface area to volume ratio, which is generally useful in heatsink design, can still be obtained using the fractal model. In addition, fractal structures provide a plurality of concave regions or cavities, providing pockets of separated flow which can generate self-sustaining oscillations and acoustic resonance. These pockets serve to reduce the acoustic resonance in turbulent flowing fluid (as compared to flat or Euclidian surfaces), thus allowing for more effective heat transfer between the fractal structure and the surrounding fluid, thereby making the fractal structure ideal for a heatsink.

U.S. Pat. No. 7,256,751, issued to Cohen, incorporated herein by reference, discusses fractal antennas. In the background of this patent, Cohen discusses Kraus' research, noting that Euclidian antennas with low area (and therefore low perimeter) exhibit very low radiation resistance and are thus inefficient. Cohen notes that the advantages of fractal antennas, over traditional antennas with Euclidian geometries, is that they can maintain the small area, while having a larger perimeter, allowing for a higher radiation resistance. Also, Cohen's fractal antenna features non-harmonic resonance frequencies, good bandwidth, high efficiency, and an acceptable standing wave ratio.

In the instant invention, this same wave theory may be applied to fractal heatsinks, especially with respect to the interaction of the heat transfer fluid with the heatsink. Thus, while the heat conduction within a solid heatsink is typically not modeled as a wave (though modern thought applies phonon phenomena to graphene heat transport), the fluid surrounding the heating certainly is subject to wave phenomena, complex impedances, and indeed the chaotic nature of fluid eddies may interact with the chaotic surface configuration of the heatsink.

The efficiency of capturing electric waves in a fractal antenna, achieved by Cohen, in some cases can be translated into an efficiency transferring heat out of an object to be cooled in a fractal heatsink as described herein. See, Boris Yakobson, "Acoustic waves may cool microelectronics", Nano Letters, ACS (2010). Some physics scholars have suggested that heat can be modeled as a set of phonons. Convection and thermal radiation can therefore be modeled as the movement of phonons. A phonon is a quasiparticle characterized by the quantization of the modes of lattice vibration of solid crystal structures. Any vibration by a single phonon is in the normal mode of classical mechanics, meaning that the lattice oscillates in the same frequency. Any other arbitrary lattice vibration can be considered a superposition of these elementary vibrations. Under the phonon model, heat travels in waves, with a wavelength on the order of 1 μm. In most materials, the phonons are incoherent, and therefore a macroscopic scales, the wave nature of heat transport is not apparent or exploitable.

The thermodynamic properties of a solid are directly related to its phonon structure. The entire set of all possible phonons combine in what is known as the phonon density of states which determines the heat capacity of a crystal. At absolute zero temperature (0 Kelvin or −273 Celsius), a crystal lattice lies in its ground state, and contains no phonons. A lattice at a non-zero temperature has an energy that is not constant, but fluctuates randomly about some mean value. These energy fluctuations are caused by random lattice vibrations, which can be viewed as a gas-like structure of phonons or thermal phonons. However, unlike the atoms which make up an ordinary gas, thermal phonons can be created and destroyed by random energy fluctuations. In the language of statistical mechanics this means that the chemical potential for adding a phonon is zero. For a more detailed description of phonon theory, see the Wikipedia article thereon available at en.wikipedia.org/wiki/Phonon (last accessed Apr. 16, 2010) incorporated herein by reference.

In certain materials, such as graphene, phonon transport phenomena are apparent at macroscopic levels, which make phonon impedance measurable and useful. Thus, if a graphene sheet were formed to resonate at a particular phonon wavelength, the resonant energy would not be emitted. On the other hand, if the graphene sheet were configured using a fractal geometry, the phonon impedance would be well controlled over a broad range of wavelengths, with sharp resonances at none, leading to an efficient energy dissipation device.

Many fractal designs are characterized by concave regions or cavities. See, for example, FIGS. 2 and 3. While sets of concavities may be useful in improving aerodynamics and fluid dynamics to increase turbulence, if they are disposed in a regular array, they will likely produce an acoustic resonance, and may have peaks in a fluid impedance function. On the other hand, the multiscale nature of a fractal geometric design will allow the system to benefit from the concavities, while avoiding a narrowly tuned system.

The present system proposes a fractal-shaped heatsink for the purpose of dissipating heat. The benefits of a fractal heatsink, over a traditional heatsink having a Euclidian geometry may include: (1) the fractal heatsink has a greater surface area, allowing for more exposure of the hot device to the surrounding air or liquid and faster dissipation of heat; and (2) due to the plethora of concave structures or cavities in fractal structures, the fractal heatsink is better able to take advantage of flow mechanics than a traditional heatsink, resulting in heat entering and exiting the heatsink more quickly (3) acoustic properties, especially in forced convection systems.

The invention provides a heatsink to cool an object through convection or radiation. For the smallest heatsink elements, on the order of 10-100 nm, the focus of the heat transfer will be on radiation rather than convection. Electron emission and ionization may also be relevant. Larger heatsink elements, approximately >1 mm in size, will generally rely on convection as the primary form of heat transfer.

In one embodiment, the heatsink comprises a heat exchange device with a plurality of heat exchange elements having a fractal variation therebetween. A heat transfer fluid, such as air, water, or another gas or liquid, is induced to flow through the heat exchange device. The heat transfer fluid has turbulent portions. The fractal variation in the plurality of heat exchange elements substantially reduces the narrow band acoustic resonance as compared to a heatsink having a linear or Euclidian geometric variation between the plurality heat exchange elements. The turbulent flow also disturbs the stagnant surface boundary layer, leading to more efficient heat transfer.

When a heat transfer fluid (air, gas or liquid) is induced to flow over a surface, there may be turbulence in the fluid. The fractal shape of the heatsink serves to reduce the energy lost due to the turbulence, while increasing the surface area of the heatsink subject to turbulence, due to the plethora of concave regions, cavities, and pockets. Therefore, the efficiency of heat transfer may be increased as compared to a heat exchange device having a linear or Euclidian geometric variation between several heat exchange elements.

Preferably, the heat exchange device will include a highly conductive substance whose heat conductivity exceeds 850 W/(m*K). Examples of such superconductors include graphene, diamond, and diamond-like coatings. Alternatively, the heat exchange device may include carbon nanotubes.

Various variations on this heatsink will be apparent to skilled persons in the art. For example, the heatsink could include a heat transfer surface that is connected to the heat exchange device and is designed to accept a solid to be cooled. Alternatively, there could be a connector that is designed to connect with a solid to be cooled in at least one point. In another embodiment, there are at least three connectors serving to keep the solid and the heatsink in a fixed position relative to one another. Various connectors will be apparent to persons skilled in the art. For example, the connector could be a point connector, a bus, a wire, a planar connector or a three-dimensional connector. In another embodiment, the heatsink has an aperture or void in the center thereof designed to accept a solid to be cooled.

This heatsink is intended to be used to cool objects, and may be part of a passive or active system. Modern three-dimensional laser and liquid printers can create objects such as the heatsinks described herein with a resolution of features on the order of about 16 μm, making it feasible for those of skilled in the art to use such fabrication technologies to produce objects with a size below 10 cm. Alternatively, larger heatsinks, such as car radiators, can be manufactured in a traditional manner, designed with an architecture of elements having a fractal configuration. For example, a liquid-to-gas heat exchanger (radiator) may be provided in which segments of fluid flow conduit have a fractal relationship over three levels of recursion, i.e., paths with an average of at least two branches. Other fractal design concepts may be applied concurrently, as may be appropriate.

Yet another embodiment of the invention involves a method of cooling a solid by connecting the solid with a heatsink. The heatsink comprises a heat exchange device having a plurality of heat exchange elements having a fractal variation therebetween. A heat transfer fluid having turbulent portions is induced to flow with respect to the plurality of heat exchange elements. The fractal variation in the plurality of heat exchange elements serves to substantially reduce narrow band resonance as compared to a corresponding heat exchange device having a linear or Euclidean geometric variation between a plurality of heat exchange elements.

A preferred embodiment provides a surface of a solid heatsink, e.g., an internal or external surface, having fluid thermodynamical properties adapted to generate an asymmetric pattern of vortices over the surface over a range of fluid flow rates. For example, the range may comprise a range of natural convective fluid flow rates arising from use of the heatsink to cool a heat-emissive object. The range may also comprise a range of flow rates arising from a forced convective flow (e.g., a fan) over the heatsink.

The heatsink may cool an unconstrained or uncontained fluid, generally over an external surface of a heatsink, or a constrained or contained fluid, generally within an internal surface of a heatsink.

DETAILED DESCRIPTION OF THE PREFERRED EMBODIMENTS

Figure 2:
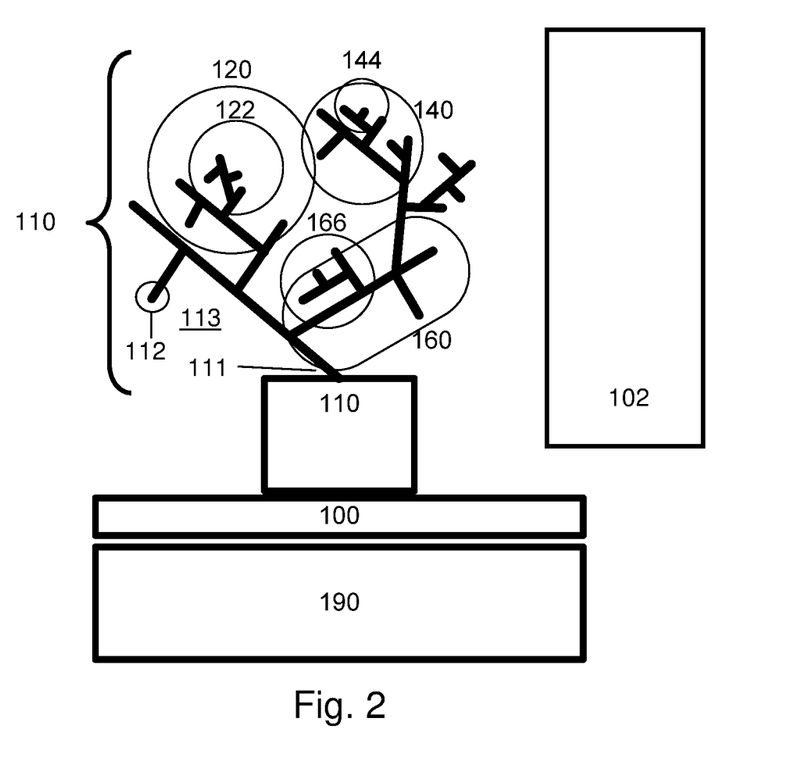
FIG. 2 illustrates a fractal heatsink that is an exemplary embodiment of the invention. In this embodiment, the heatsink is placed adjacent to the object to be cooled.

FIG. 2 illustrates a heatsink implementing an exemplary embodiment of this invention. Note that the illustration is in two dimensions, but a three dimensional embodiment is both possible and preferred. There is a heat transfer surface 100 that allows the heatsink to rest comfortably on a surface, such as the solid to be cooled 190, through a connector, not shown in FIG. 2. In the illustrated embodiment, the heat transfer surface 100 is roughly planar, having a closed Euclidian cross-section on the bottom. However, it might also have another shape, for example if the solid to be cooled does not have a planar face. A fractal-shaped heat exchange device 110 begins at point 111. While only one fractal heatsink is illustrated here, skilled persons in the art will recognize other similar fractal heatsinks that are also intended to be covered by the invention. Note that the heatsink has three branches leaving from point 111—branch 120, branch 140, and branch 160. Also note that the branch structure initiating from point 111 is nearly identical to that at point 122 and 142, even though only point 111 is a true starting point. Thus, the fractal property of self-similarity is preserved. We call the structure that begins at point 111 the "first motif," the structure from point 122 the "second motif," and the structure that begins from point 142 the "third motif." Note that, in the embodiment illustrated in FIG. 2, the replication from first to second motif and from second to third motif involves a linear displacement (upward) and a change of scale. In branches not going in the same direction as the prior branch, there is also a rotation. Under the limitations for ideal fractals, the second motif and third motif must be a smaller, exact copy of the first motif. However, due to the limitations imposed by human-made structures and machines, the fractals designed here are generally finite and the second motif will thus be an inexact copy of the first motif, i.e. if there are N levels starting from the first motif, the second motif level will have N−1 levels, if N is very large, the difference is insignificant. In other words, the self-similarity element required in fractals is not preserved perfectly in the preferred designs due to the limitations of available machinery. In addition, the benefits are achieved without requiring fractal relationships over more than a few "orders" of magnitude (iterations of the fractal recursive algorithm). For example, in the embodiment illustrated in FIG. 2, there are no continuing branch divisions and iterations at point 162, even though an ideal fractal would have them. In an ideal fractal, there would be an infinite number of sub-branches from 110, 122, and 142. However, an imperfect fractal shape, as illustrated in FIG. 2, will serve the purposes of this invention.

Persons of ordinary skill in the art will appreciate the advantages offered by the structure 110 in FIG. 2. The fractal heatsink has a much larger surface area than the heat transfer surface alone because all of the "branches" and "leaves" of the fern-like fractal shape serve to increase the surface area of their circumferential external surface boundary 112 with respect to a heat transfer fluid 113. In addition, if a heat transfer fluid is induced to flow above the heat transfer surface 100, such as by operation of fan 102, the turbulent portions of the heat transfer fluid near the surface will be increased by the textures inherent in the fractal variation in the heat exchange structure 110. Because the fractal pattern is itself non-identically repeating within the fractal design, this will serve to substantially reduce narrow band acoustic resonance as compared to a corresponding heat exchange device having a repeating design, e.g., a linear or geometric variation between several heat exchange elements, thereby further aiding in the heat transfer process.

In a preferred embodiment, the heat transfer surface 100 and the roughly fractal-shaped heat exchange structure 110 are all made out of an efficient heat conductor, such as copper or aluminum, or more preferably, having a portion whose heat conductivity exceeds 850 W/(m*K), such as graphene with a heat conductivity of between 4840 and 5300 W/(m*K) or diamond with a heat conductivity between 900 and 2320 W/(m*K). This would allow heat to quickly enter the heatsink from the solid and for heat to quickly exit the heatsink through the branches and leaves of the fern-like fractal-shaped heat exchange structure 110. In another embodiment, the heatsink is formed, at least in part, of carbon nanotubes, which display anisotropic heat conduction, with an efficient heat transfer along the long axis of the tube. Carbon nanotubes are submicroscopic hollow tubes made of a chicken-wire-like or lattice of carbon atoms. These tubes have a diameter of just a few nanometers and are highly heat conductive, transferring heat much faster than diamond, and in some cases comparable to graphene. See web.mit.edu/press/2010/thermopower-waves.html (last accessed Apr. 15, 2010) incorporated herein by reference.

Also note that this exemplary embodiment provides a plethora of openings, e.g. 124 and 126, between the branches or fractal subelements to ensure that all of the branches are exposed to the surrounding air, gas or liquid and to allow the heat to escape from the heatsink into the surroundings. In one embodiment of the invention, at least two of these openings are congruent, as are openings 124 and 126 illustrated here. An embodiment of the invention allows the openings to be filled with the air or liquid from the surrounding medium. Due to the limitation imposed by the solid's flat shape, it is not possible to increase the exposure of the fern-like fractal to the solid. However, the air or liquid outside of the solid are perfect for the fractal's exposure.

Under the phonon model of heat exchange, applicable to carbon nanotubes, graphene materials, and perhaps others, the fractal shape is advantageous to ensure the escape of the phonons into the surrounding fluid medium because the fractal guarantees close to maximal surface exposure to the medium and does not have many parts that are not exposed, as is a problem with many prior art heatsinks. Skilled persons in the art will realize that this could be achieved through many known structures. For example, graphene, which is one-atom-thick carbon and highly heat conductive, would be an advantageous material to use to build the fractal heatsink herein described.

When a turbulently flowing fluid passes around an obstacle, concave regions or cavities in the obstacle create pockets of separated flow which generates self-sustaining oscillations and acoustic resonance. The concave regions or cavities have substantially reduced narrow band acoustic resonance as compared to flat regions on the obstacle. This allows for more energy to be available for heat transfer. Skilled persons in the art will note that fractal structure 110, as many other fractal structures, has a plurality of concave regions to allow for an implementation of this effect.

Figure 3:
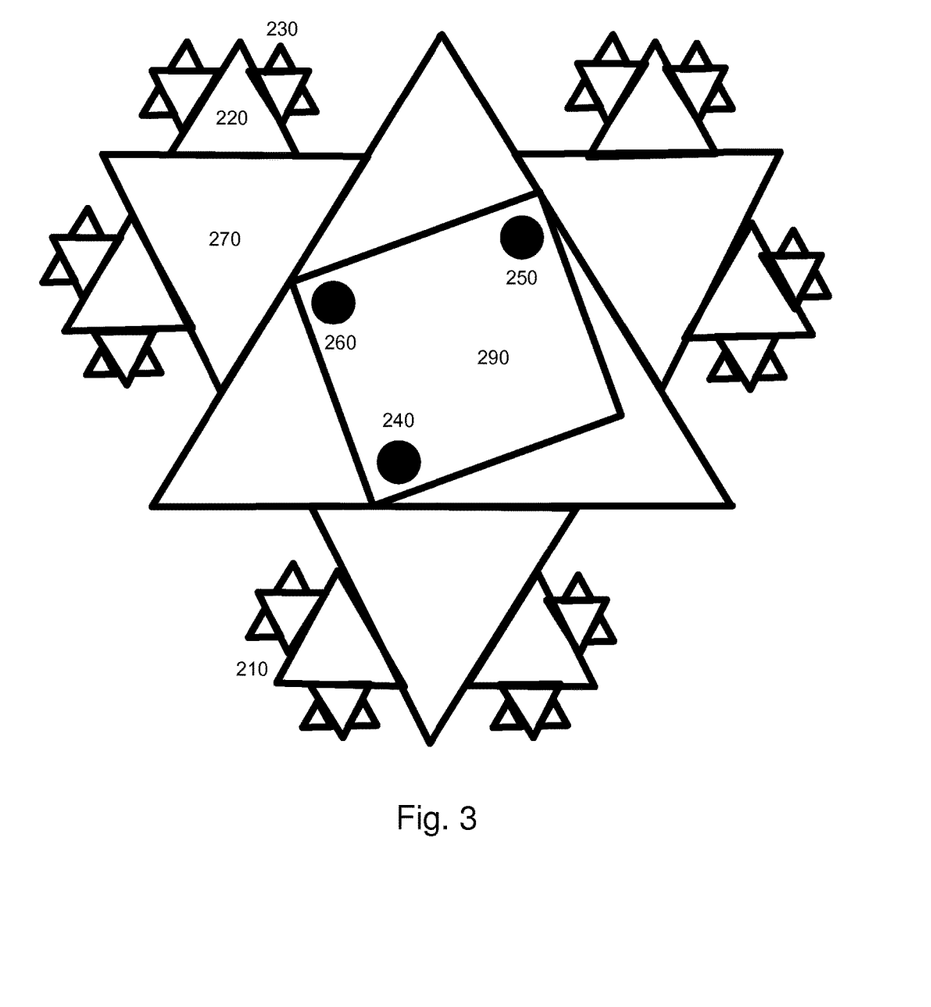
FIG. 3 illustrates a fractal heatsink that is an exemplary embodiment of the invention. In this embodiment, the heatsink is placed either adjacent to or surrounding the object to be cooled.

FIG. 3 illustrates another embodiment of the invention. A solid to be cooled that has an arbitrary shape 290 is located inside (illustrated) or outside (not illustrated) a two-dimensional or three-dimensional roughly fractal shaped 210 heatsink. In one embodiment, the heatsink 210 has an aperture 270 designed to hold the solid. Alternatively, the solid to be cooled might be located outside of the heatsink (not illustrated). Note that, as in FIG. 2, the fractal heat exchange element has multiple motifs, starting with the large triangle at 210, to progressively smaller triangles at 220 and 230. However, note that the fractal does not keep extending infinitely and there are no triangles smaller than the one at 230. In other words, the fractal heatsink 210 has multiple recursive fractal iterations 220 and 230, but the fractal iterations stop at level 230 for simplicity of design and manufacturability. Also note that the fractal submotifs 220 and 230 are of different dimensional sizes from the original fractal motif 210 and protrude from the original fractal shape 210. Here, the first motif is a large triangle, and the latter motifs are smaller triangles, which involve a rotation, linear displacement, and change of scale of the prior motif. In one embodiment, the fractal shape has some apertures in it (not illustrated) to allow the solid to be cooled to connect with other elements. Also, the solid to be cooled is connected to the fractal shape at point connector 240 and through bus wires at 250 and 260. The solid should be connected to the fractal heatsink in at least one point, either through a point connection, a bus wire connection, or some other connection. If it is desired that the solid be fixed inside the heatsink, there may be at least three connection points, as illustrated. However, only one connection point is necessary for heat convection and radiation from the solid to the heatsink. Preferably, the point or bus wire connection is built using a strong heat conductor, such as carbon nanotubes or a diamond-like coating.

Figure 1:
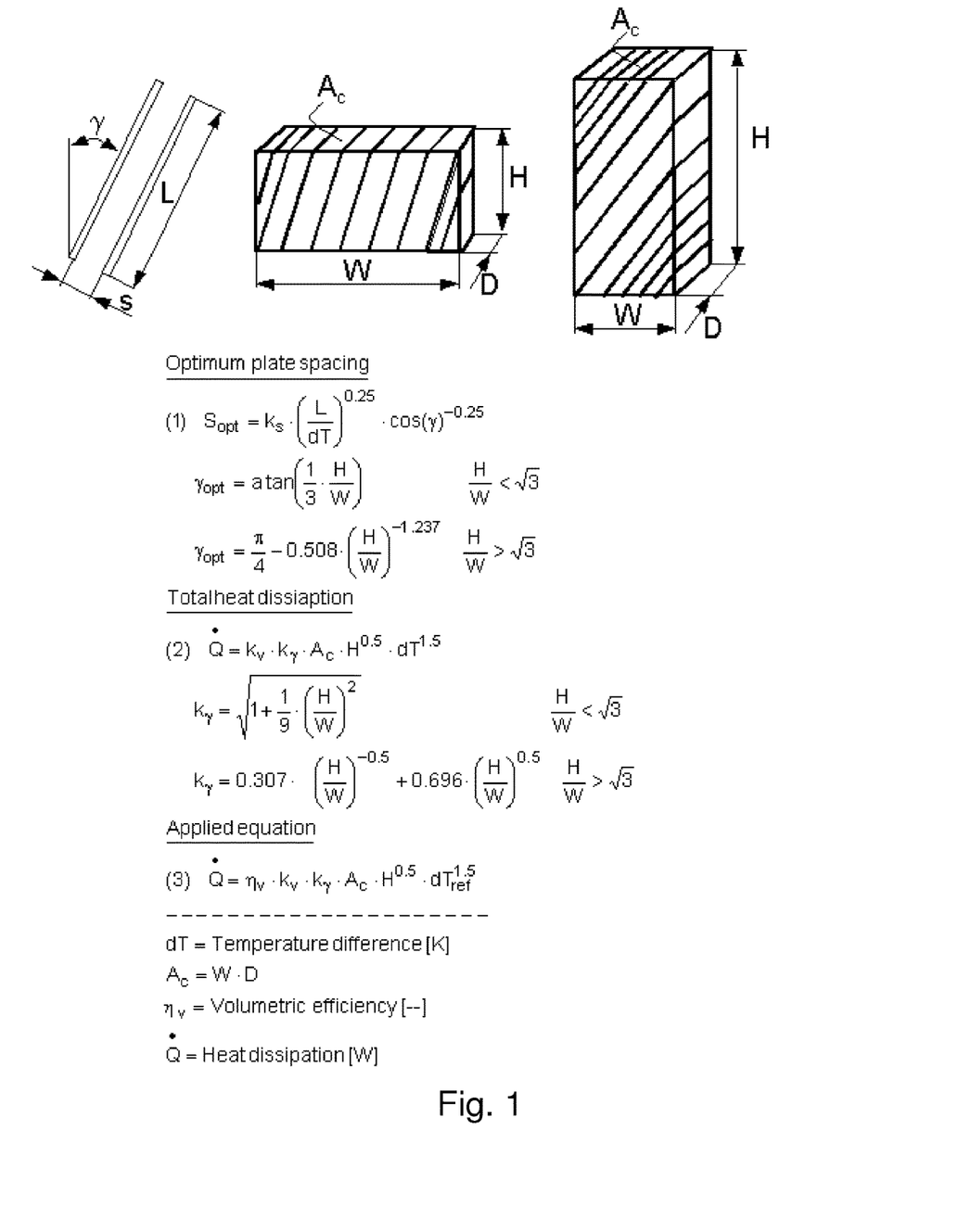
FIG. 1 shows a set of governing equations for a parallel plate heatsink.

Note that, as in FIG. 1, the fractal structure 210 in FIG. 2 has multiple concave regions or cavities. When a turbulently flowing fluid passes around this fractal heatsink, the concave regions or cavities substantially reduce the narrow band acoustic resonance as compared to a flat or Euclidian structure. This allows for more energy to be available to for heat transfer.

In yet another embodiment of the invention, the heatsink 210 in FIG. 3 could be constructed without the connections at points 240, 250, and 260. In one embodiment, a liquid or gas would fill the aperture 270 with the intent that the liquid or gas surround the solid to be cooled, hold it in place, or suspend it. Preferably, the liquid or gas surrounding the solid would conduct heat from the solid to the heatsink, which would then cause the heat to exit.

Those skilled in the art will recognize many ways to fabricate the heatsinks described herein. For example, modern three-dimensional laser and liquid printers can create objects such as the heatsinks described herein with a resolution of features on the order of 16 μm. Also, it is possible to grow a crystal structure using a recursive growth algorithm or through crystal growth techniques. For example, US Patent Application No. 2006/0037177 by Blum, incorporated herein by reference, describes a method of controlling crystal growth to produce fractals or other structures through the use of spectral energy patterns by adjusting the temperature, pressure, and electromagnetic energy to which the crystal is exposed. This method might be used to fabricate the heatsinks described herein. For larger heatsinks, such as those intended to be used in car radiators, traditional manufacturing methods for large equipment can be adapted to create the fractal structures described herein.

In this disclosure, we have described several embodiments of this broad invention. Persons skilled in the art will definitely have other ideas as to how the teachings of this specification can be used. It is not our intent to limit this broad invention to the embodiments described in the specification. Rather, the invention is limited by the following claims.

What is claimed is:
1. A heatsink comprising:
   a heat exchange device having a plurality of heat exchange elements,
   each heat exchange element having an external surface exposed to a heat exchange medium and a set of parameters defining at least a size of corresponding spatial features of the heat exchange element, the plurality of heat exchange elements each having a branched configuration having at least three consecutive respective levels of branching which project into the heat exchange medium, based on an iterative, recursive fractal algorithm defining a fractal variation between the set of parameters of the heat exchange element at each of the at least three consecutive respective levels, with respect to a respective heat exchange element at adjacent level, algorithmically defining a connected fractal spatial structure in which a basic spatial shape is subject to a spatial rotation, a spatial displacement, and a spatial change of scale of the corresponding spatial features of the heat exchange elements of each respective level with respect to a prior level and connecting to the prior level, characterized by a decreasing scale of the corresponding spatial features with increasing consecutive respective level;

a thermal transfer surface configured to transfer heat between an object having a different temperature than the heat exchange device; and a flow inducing device configured to cause the heat exchange medium to flow over the external surfaces of the heat exchange elements and produce an acoustic emission, wherein the fractal variation of the set of parameters in the branches of the plurality of heat exchange elements substantially distribute a power of resonances in the acoustic emission over a band.

2. The heatsink according to claim 1, wherein the heat transfer medium is induced to flow turbulently with respect to the external surface of the heat exchange elements.

3. The heatsink according to claim 1, wherein the plurality of heat exchange elements branch in two dimensions.

4. The heatsink according to claim 1, wherein the plurality of heat exchange elements branch in three dimensions.

5. The heatsink of claim 1, where the heat exchange device comprises graphene.

6. The heatsink of claim 1, where the heat exchange device comprises a composition having an extended regular lattice which effectively supports phonon transport.

7. The heatsink of claim 1, where the heat exchange device comprises carbon nanotubes.

8. The heatsink of claim 1, further comprising at least one connector configured to retain the thermal transfer surface to a device to be cooled.

9. A heatsink for cooling a solid composition, comprising:
a plurality of heat exchange elements defining a branched network extending into a flowing heat exchange medium, having a fractal branching pattern of a connected spatial structure over at least three levels of branching based on an iterative, recursive fractal algorithm which defines a change of spatial scale, a spatial displacement and a spatial rotation of a basic spatial element defining each heat exchange element with respect to a preceding level of branching, characterized by a reduced physical dimensions of the basic spatial element defining the plurality of heat exchange elements with increasing level of branching, each heat exchange element having an external surface configured to transfer heat to the flowing heat exchange medium;
a heat transfer surface in thermal contact with the solid composition; and
an air flow inducer, configured to induce a flow of the heat exchange medium relative to the external surfaces of the heat exchange elements, to thereby transfer heat between the solid composition and the heat transfer surface, and between the heat transfer surface and the heat exchange medium, wherein the heat exchange medium has a different temperature than the solid composition,
wherein the plurality of heat exchange elements having the fractal branching pattern are configured to interact with the flowing heat transfer medium, to induce a broadband acoustic emission.

10. The heatsink according to claim 9, wherein the air flow inducer comprises a fan, the fractal branching pattern provides a central void space, and the heat transfer medium comprises air, which is induced to flow in the central void space by the fan.

11. A heatsink comprising:
a heat exchange device having a plurality of heat exchange elements emanating from a root in a branched pattern having at least three levels of branching,
each heat exchange element having an external surface boundary with respect to a heat transfer fluid,
the heat exchange device having a connected configuration of the plurality of heat exchange elements based on an iterative recursive fractal algorithm defining fractal parameters comprising, for each iterative level of the iterative recursive fractal algorithm, a spatial rotation, a spatial displacement, and a change of spatial scale of a spatial basic shape, with respect to another respective heat exchange element at a respectively preceding level of branching of the iterative recursive fractal algorithm, to define a connected distal branch, and
a fan, configured to cause the heat transfer fluid to flow with respect to the external surface boundary of each heat exchange element, to generate flow-induced vortices at locations of the external surface boundary of each heat exchange element dependent on the defining fractal parameters, resulting in non-narrow band resonant acoustic emissions,
wherein the external surface boundary of each of the plurality of heat exchange elements are together configured to cause a flowing heat
exchange fluid to form vortices which are substantially non-uniformly distributed about the heat exchange device.

12. The heatsink according to claim 11, further comprising a heat transfer surface configured to receive heat by thermal diffusion from a device to be cooled.

13. The heatsink according to claim 12, further comprising a thermal interface material at said heat transfer surface configured to communicate heat between the device to the cooled and the heat exchange device.

14. The heatsink according to claim 12, further comprising at least one connector, configured to affix the heatsink to a solid object associated with a source of heat.

15. The heatsink according to claim 11, wherein the external surface boundary of adjacent heat transfer elements form a set of interconnected external solid-gas interface surfaces, having the configuration of the plurality of heat exchange elements defined by the iterative recursive fractal algorithm.

16. The heatsink according to claim 11, wherein each branch of the branched pattern is non-identically shaped with respect to another branch at a common level of the branched pattern, and have respective physical configurations which differ according to the iterative recursive fractal algorithm.

17. The heatsink according to claim 11, wherein the plurality of heat exchange elements are together configured to chaotically distribute vortices induced by fluid flow over the external surface boundary of the plurality of heat exchange elements.

18. A heatsink, comprising:
a plurality of external heat exchange surfaces of a solid thermally conductive medium, shaped according to a fractal geometry to define a plurality of features which are interrelated according to a fractal relationship of properties in three dimensions according to at least two recursions of a recursive fractal algorithm defining a plurality of iterative recursions, each iterative recursion comprising a spatial rotation, a spatial displacement, and a change of spatial scale of a basic spatial shape of a first external heat exchange surface of the plurality of external heat exchange surfaces with respect to a second external heat exchange surface of the plurality of external heat exchange surfaces defined in a prior iterative recursion of the recursive fractal algorithm to which it is spatially connected,
the plurality of external heat exchange surfaces being configured to convectively and radiatively transfer heat from the solid thermally conductive medium to an external surrounding liquid or gaseous medium, and to chaotically distribute vortices induced by flow of the external surrounding liquid or gaseous medium, resulting in non-narrow band resonant acoustic emissions; and
an interface surface, configured to mate with and transfer heat from a heat source into the solid thermally conductive medium, and from the solid thermally conductive medium through the external heat exchange interface to the external surrounding liquid or gaseous medium.

19. The heatsink according to claim 18, wherein the external surrounding liquid or gaseous medium is gaseous.

20. The heatsink according to claim 19, further comprising a fan configured to induce a turbulent flow of the surrounding liquid or gaseous medium with respect to the plurality of external heat exchange surfaces.

21. The heatsink according to claim 18, where the solid thermally conductive medium comprises at least one of graphene, artificial diamond, and nanotubes.

22. The heatsink according to claim 18, wherein the plurality of external heat exchange surfaces together have a fractal topology in three dimensions, defined by at least three recursions of the recursive fractal algorithm.

23. The heatsink according to claim 1, wherein the branched configuration has a fractal topology extending in at least three spatial dimensions defined by the recursive fractal algorithm.

* * * * *